United States Patent
Lee et al.

(10) Patent No.: US 11,130,838 B2
(45) Date of Patent: Sep. 28, 2021

(54) CARDO-BASED BINDER RESIN, PHOTOSENSITIVE RESIN COMPOSITION COMPRISING SAME, BLACK MATRIX, COLOR FILTER, AND DISPLAY DEVICE

(71) Applicant: LG CHEM, LTD., Seoul (KR)

(72) Inventors: Doyun Lee, Daejeon (KR); Kwang Han Park, Daejeon (KR); Eunjoo Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 45 days.

(21) Appl. No.: 16/635,235

(22) PCT Filed: Feb. 1, 2019

(86) PCT No.: PCT/KR2019/001450
§ 371 (c)(1),
(2) Date: Jan. 30, 2020

(87) PCT Pub. No.: WO2019/194402
PCT Pub. Date: Oct. 10, 2019

(65) Prior Publication Data
US 2020/0181322 A1    Jun. 11, 2020

(30) Foreign Application Priority Data

Apr. 6, 2018   (KR) .................. 10-2018-0040452

(51) Int. Cl.
*G02B 5/20* (2006.01)
*G03F 7/038* (2006.01)
*C08G 63/66* (2006.01)
*G03F 7/028* (2006.01)
*G03F 7/033* (2006.01)
*G03F 7/00* (2006.01)

(52) U.S. Cl.
CPC .............. *C08G 63/66* (2013.01); *G02B 5/20* (2013.01); *G03F 7/0007* (2013.01); *G03F 7/028* (2013.01); *G03F 7/033* (2013.01); *G03F 7/038* (2013.01)

(58) Field of Classification Search
CPC ........ G03F 7/0007; G03F 7/027; G03F 7/028; G03F 7/033; G03F 7/038; G02B 5/223; G02F 1/133514; G02F 1/133516; C08G 63/66
USPC .................... 430/7, 286.1; 349/106
See application file for complete search history.

(56) References Cited

U.S. PATENT DOCUMENTS

| 8,338,559 B2 | 12/2012 | Heo et al. |
| 2010/0085518 A1 | 4/2010 | Choi et al. |
| 2011/0151379 A1 | 6/2011 | Choi et al. |
| 2012/0196949 A1 | 8/2012 | Heo et al. |
| 2015/0226892 A1 | 8/2015 | Liao et al. |
| 2018/0011404 A1 | 1/2018 | Hashimoto et al. |
| 2019/0241701 A1 | 8/2019 | Kim et al. |
| 2019/0278173 A1 | 9/2019 | Kim et al. |

FOREIGN PATENT DOCUMENTS

| CN | 101591423 A | 12/2009 |
| CN | 101965375 A | 2/2011 |
| CN | 102216852 A | 10/2011 |
| CN | 103969948 A | 8/2014 |
| CN | 103980472 A | 8/2014 |
| CN | 109476831 A | 3/2019 |
| CN | 111032720 A | 4/2020 |
| JP | 2008-156613 A * | 7/2008 |
| JP | 2009-053388 A | 3/2009 |
| JP | 2011-006564 A * | 1/2011 |
| JP | 2014-118480 A * | 6/2014 |
| KR | 10-2008-0077480 A | 8/2008 |
| KR | 10-2008-0077815 A | 8/2008 |
| KR | 10-2009-0009236 A | 1/2009 |
| KR | 10-2009-0056735 A | 6/2009 |
| KR | 10-2011-0071965 A | 6/2011 |
| KR | 10-2011-0076489 A | 7/2011 |
| KR | 10-2014-0026660 A | 3/2014 |
| KR | 10-2015-0066884 A | 6/2015 |
| KR | 10-1740632 B1 | 5/2017 |
| KR | 10-2017-0132816 A | 12/2017 |
| KR | 10-1840347 B1 | 3/2018 |
| WO | 2010-038978 A1 | 4/2010 |
| WO | 2019/073806 A1 | 4/2019 |

OTHER PUBLICATIONS

International Search Report issued for International Application No. PCT/KR2019/001450 dated May 17, 2019.
Guanglong Wu, "Synthesis and characterization of photo-crosslinkable polyfluorene with acrylate side-chains," Journal of Applied Polymer Science, May 2006, vol. 100, No. 3, pp. 2336-2342, Abstract only.

* cited by examiner

*Primary Examiner* — John A McPherson

(74) *Attorney, Agent, or Firm* — Rothwell, Figg, Ernst & Manbeck, P.C.

(57) ABSTRACT

The present specification provides a cardo-based binder resin represented by Chemical Formula 1, and a photosensitive resin composition, a black matrix, a color filter and a display apparatus including the same.

12 Claims, No Drawings

CARDO-BASED BINDER RESIN, PHOTOSENSITIVE RESIN COMPOSITION COMPRISING SAME, BLACK MATRIX, COLOR FILTER, AND DISPLAY DEVICE

This application is a 35 U.S.C. 371 National Phase Entry Application from PCT/KR2019/001450, filed on Feb. 1, 2019, and designating the United States, which claims priority to and the benefits of Korean Patent Application No. 10-2018-0040452, filed with the Korean Intellectual Property Office on Apr. 6, 2018, the entire contents of which are incorporated herein by reference.

TECHNICAL FIELD

The present specification relates to a cardo-based binder resin, and a photosensitive resin composition, a black matrix, a color filter and a display apparatus comprising the same.

BACKGROUND ART

The present disclosure relates to a cardo-based binder resin and a photosensitive resin composition comprising the same. In addition, the present disclosure relates to a black matrix, a color filter and a display apparatus formed using the photosensitive resin composition.

A display apparatus employs various black photosensitive compositions such as a black matrix, a black bank and a black column spacer for light shielding, high definition, high contrast ratio (CR), reducing external light reflection and the like.

However, as the importance of light shielding and external light reflection increases, a content of a pigment increases and a content of a binder resin and the like decreases in the black photosensitive resin composition causing decline in developability resistance, chemical resistance, development adhesive strength and re-solubility as well as composition stability.

In addition, as pattern types to obtain by using a black photosensitive resin become diverse to a black matrix, a gap spacer, a touch spacer and the like, and, in order to obtain such two or more patterns in one process, patterns having different thicknesses are obtained by adjusting mask transmittance, development of materials for satisfying existing processability while maintaining pattern adhesive strength at a low exposure amount has been required.

DISCLOSURE

The present specification is directed to providing a cardo-based binder resin, and a photosensitive resin composition, a black matrix, a display apparatus and a color filter comprising the same.

One embodiment of the present specification provides a cardo-based binder resin represented by the following Chemical Formula 1.

[Chemical Formula 1]

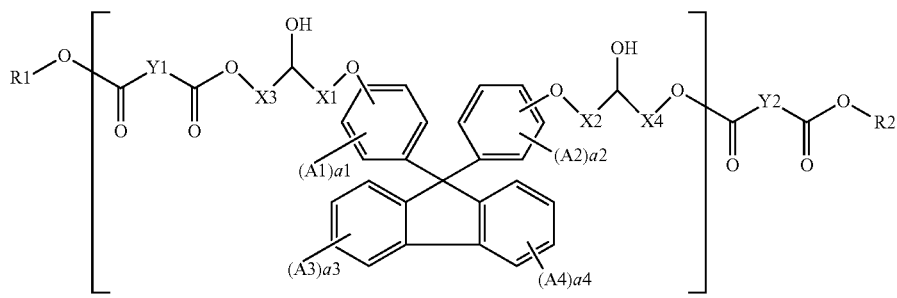

wherein, in Chemical Formula 1,
R1 and R2 are hydrogen or represented by the following Chemical Formula 2,
at least one of R1 and R2 is represented by the following Chemical Formula 2, and
n is an integer of 1 to 50,

[Chemical Formula 2]

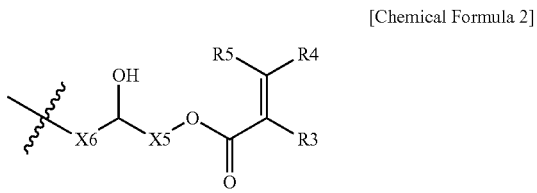

wherein, in Chemical Formula 2,

represents a site linked to Chemical Formula 1,
X1 to X6 are a substituted or unsubstituted alkylene group; or a substituted or unsubstituted alkylene oxide group,
Y1 and Y2 are selected from the group consisting of a substituted or unsubstituted alkylene group; a substituted or unsubstituted cycloalkylene group; a substituted or unsubstituted cycloalkenylene group; and a substituted or unsubstituted arylene group,
R3 to R5 are the same as or different from each other, and each independently hydrogen; or a substituted or unsubstituted alkyl group,
A1 to A4 are the same as or different from each other, and each independently selected from the group consisting of hydrogen; deuterium; a halogen group; a nitrile group; a nitro group; a hydroxyl group; an ester group; an imide group; an amide group; a substituted or unsubstituted alkoxy group; a substituted or unsubstituted alkyl group; a substituted or unsubstituted cycloalkyl group; a substituted or Hereinafter, the present specification will be described in more detail.

One embodiment of the present specification provides a cardo-based binder resin represented by the following Chemical Formula 1.

[Chemical Formula 1]

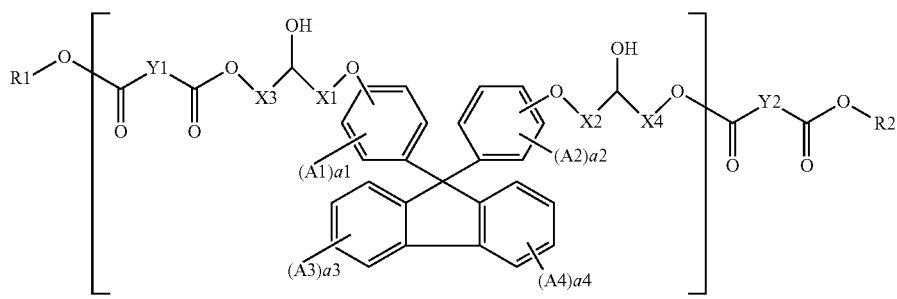

unsubstituted alkenyl group; a substituted or unsubstituted cycloalkenyl group; a substituted or unsubstituted silyl group; a substituted or unsubstituted boron group; a substituted or unsubstituted phosphine oxide group; a substituted or unsubstituted phosphine group; a substituted or unsubstituted sulfonyl group; a substituted or unsubstituted amine group; a substituted or unsubstituted aryl group; and a substituted or unsubstituted heteroaryl group, and a1 to a4 are an integer of 0 to 4, and when a1 to a4 are 2 or greater, structures in the parentheses ( ) are the same as or different from each other.

Another embodiment of the present specification provides a photosensitive resin composition comprising the cardo-based binder resin described above.

Another embodiment of the present specification provides a black matrix formed using the photosensitive resin composition described above.

Another embodiment of the present specification provides a color filter comprising the black matrix described above.

Another embodiment of the present specification provides a display apparatus comprising the black matrix described above.

Advantageous Effects

A cardo-based binder resin according to one embodiment of the present specification includes a photocurable group, and has advantages of excellent chemical resistance, developability resistance and storage stability due to a decrease in an acid group. Particularly, sensitivity is excellent even at a low exposure amount enhancing adhesive strength of a pattern.

Mode for Disclosure

In the present specification, a description of one member being placed "on" another member includes not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

wherein, in Chemical Formula 1,

R1 and R2 are hydrogen or represented by the following Chemical Formula 2, at least one of R1 and R2 is represented by the following Chemical Formula 2, and n is an integer of 1 to 50,

[Chemical Formula 2]

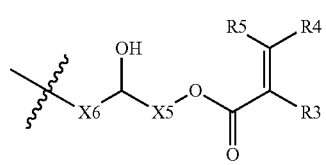

wherein, in Chemical Formula 2,

represents a site linked to Chemical Formula 1,

X1 to X6 are a substituted or unsubstituted alkylene group; or a substituted or unsubstituted alkylene oxide group, Y1 and Y2 are selected from the group consisting of a substituted or unsubstituted alkylene group; a substituted or unsubstituted cycloalkylene group; a substituted or unsubstituted cycloalkenylene group; and a substituted or unsubstituted arylene group, R3 to R5 are the same as or different from each other, and each independently hydrogen; or a substituted or unsubstituted alkyl group, A1 to A4 are the same as or different from each other, and each independently selected from the group consisting of hydrogen; deuterium; a halogen group; a nitrile group; a nitro group; a hydroxyl group; an ester group; an imide group; an amide group; a substituted or unsubstituted alkoxy group; a substituted or unsubstituted alkyl group; a substituted or unsubstituted cycloalkyl group; a substituted or unsubstituted alkenyl group; a substituted or unsubstituted cycloalkenyl group; a substituted or unsubstituted silyl group; a substituted or unsubstituted boron group; a substituted or unsubstituted phosphine oxide group; a substituted or unsubstituted phosphine group; a substituted or unsubstituted sulfonyl group; a substituted or unsubstituted amine group; a substituted or unsubstituted aryl group; and a substituted or unsubstituted heteroaryl group, and a1 to a4 are an integer of 0 to 4, and when a1 to a4 are 2 or greater, structures in the parentheses ( ) are the same as or different from each other.

A cardo-based binder resin generally includes an acid group (for example, —COOH) in order to give developability by an alkali developing solution, and may further include a photocurable group as necessary.

The cardo-based binder resin represented by Chemical Formula 1 includes a photosensitive group represented by Chemical Formula 2, and, by having an acid value of 0 mgKOH/g to 50 mgKOH/g, a low acid value, has advantages of improving chemical resistance, developability resistance and storage stability.

Specifically, by the cardo-based binder resin represented by Chemical Formula 1 including a photocurable group at the "end" of the main branch, excellent sensitivity and chemical resistance are obtained compared to cardo-based binder resins that do not include a photocurable group.

In addition, the present disclosure has advantages of excellent developability resistance and storage stability compared to cardo-based binder resins including a photocurable group as a substituent of the side branch or the main branch, and has advantages of excellent sensitivity and pattern adhesive strength even at a low exposure amount.

Moreover, by Chemical Formula 1 having a fluorene-type structure, heat resistance and numerical stability are superior, and substrate adhesive strength is excellent.

When a cardo-based binder resin does not include a photocurable group, sensitivity decreases such that sufficient curing is not obtained at a low exposure amount, and pattern fall out may occur by decreased developability resistance.

When a cardo-based binder resin includes a photocurable group as a substituent of the main branch and an acid group is present, sensitivity increases increasing a degree of curing, however, sufficient curing is obtained even at a low exposure amount reducing an exposure amount-dependent degree of curing, which may be disadvantageous in forming a level difference through mask transmittance control. In addition, when an acid group is present in a certain amount or higher, developability resistance decreases, which may cause pattern fall out.

However, the cardo-based binder resin according to one embodiment of the present specification has a photocurable group present at the end of the main branch, and has lower sensitivity compared to when a photocurable group is present as a substituent of the main branch, which is advantageous in forming a level difference through mask transmittance control. In addition, the cardo-based binder resin according to one embodiment of the present specification has no or a small amount of acid group, which leads to advantages of excellent chemical resistance and storage stability, and excellent sensitivity and pattern adhesive strength even at a low exposure amount.

When a cardo-based binder resin is prepared by reacting a bisphenol fluorene-type epoxy resin with acrylic acid, and then consecutively reacting an anhydride and glycidyl methacrylate, a photocurable group is introduced to both the side branch and the end of the main branch of the polymer chain forming the cardo-based binder resin unlike the cardo-based binder resin according to the present specification capable of introducing a photocurable group at the end of the main branch.

Specifically, a polymer chain structure including a photocurable group and a secondary alcohol is formed when reacting the bisphenol fluorene-type epoxy resin and acrylic acid, and the photocurable group is produced by an epoxy group included in the bisphenol fluorene-type epoxy resin reacting with the acrylic acid, and in this case, the photocurable group is introduced to the side branch of the polymerization reaction-progressed polymer chain. After that, the produced secondary alcohol and an anhydride go through a polymerization reaction to produce a carboxyl group (—COOH), and the carboxyl group may be produced on both the side branch and the end of the polymer chain. Then, the produced carboxyl group and glycidyl methacrylate may react to introduce a photocurable group to both the side branch and the end of the polymer chain.

On the other hand, the cardo-based binder resin according to the present specification produces a carboxyl group only at the end of the polymer chain by reacting a bisphenol fluorene-type epoxy resin and cyclohexene dicarboxylic acid, and the carboxyl group (—COOH) reacts with glycidyl methacrylate to produce a photocurable group at the end of the polymer chain. In other words, the cardo-based binder resin according to the present specification may selectively introduce a photocurable group at the end of the polymer chain.

One embodiment of the present specification provides a cardo-based binder resin having an acid value of 0 mgKOH/g to 50 mgKOH/g.

In one embodiment of the present specification, the acid group means a substituent exhibiting acidity, and specifically, the acid group may be a carboxylic acid group (—COOH).

In one embodiment of the present specification, the acid value means an amount of potassium hydroxide (KOH) required to titrate an acid group (—COOH) included in 1 g of a polymer, and the unit is mgKOH/g.

In one embodiment of the present specification, the acid value may be from 0 mgKOH/g to 50 mgKOH/g, specifically from 0 mgKOH/g to 45 mgKOH/g, and more specifically from 0 mgKOH/g to 44 mgKOH/g. When the acid value satisfies the above-mentioned range, chemical resistance, developability resistance and storage stability may be enhanced.

In one embodiment of the present specification, the acid value of the cardo-based binder resin may vary depending on the amount of the acid group included in Chemical Formula 1. Specifically, Chemical Formula 1 may be synthesized as in the following reaction formula, and the acid value may be measured depending on the amount of the acid group included in Chemical Formula 1 after the synthesis.

[Reaction Formula]

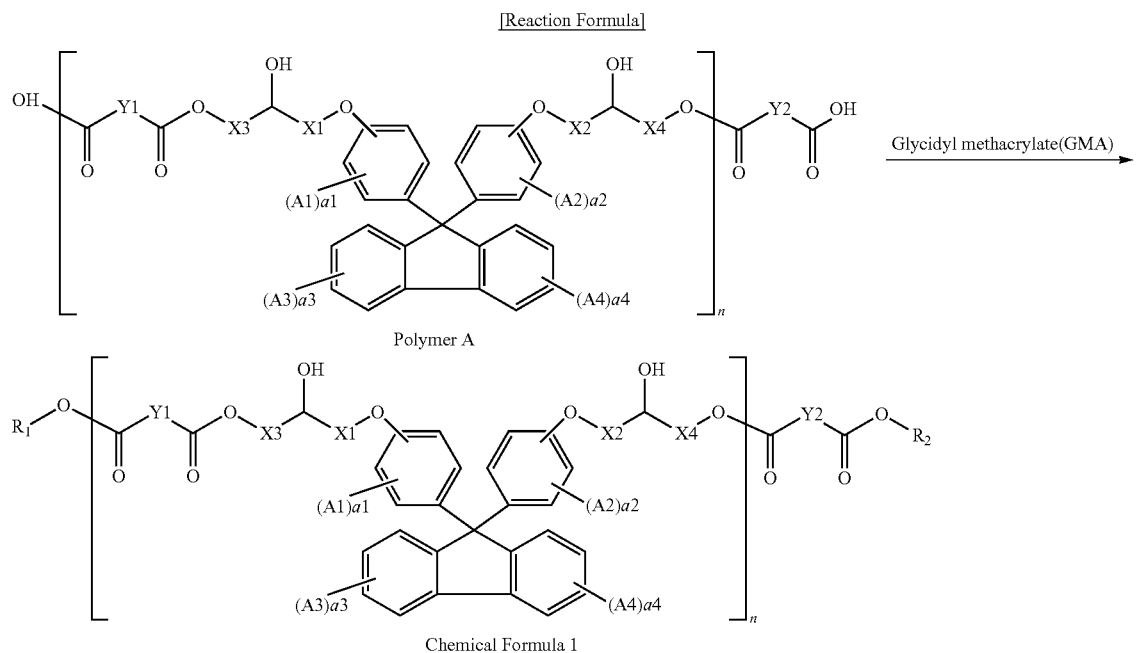

Polymer A

Chemical Formula 1

In the reaction formula,

R1, R2, n, X1 to X4, Y1, Y2, A1 to A4 and a1 to a4 have the same definitions as in Chemical Formula 1.

In the reaction formula, glycidyl methacrylate (GMA) may be represented by a chemical formula as follows.

Glycidyl methacrylate (GMA)

In the reaction formula, the number of the acid group remaining in Chemical Formula 1 may vary depending on the amount of glycidyl methacrylate reacting with Polymer A. In other words, as the introduced amount of glycidyl methacrylate increases compared to the molar number of Polymer A, the amount of the acid group remaining in Chemical Formula 1 decreases, and the acid value decreases accordingly.

For example, when reacting the same molar number of glycidyl methacrylate as the molar number of Polymer A, the acid group does not remain in Chemical Formula 1, and therefore, the acid value is 0 mg KOH/g. When reacting ¾ of glycidyl methacrylate with respect to the molar number of Polymer A, the acid group remains in Chemical Formula 1 in ¼ of the molar number of Polymer A, and in this case, the acid value may be 28 mg KOH/g. In addition, when reacting ½ of glycidyl methacrylate with respect to the molar number of Polymer A, the acid group remains in Chemical Formula 1 in ½ of the molar number of Polymer A, and in this case, the acid value may be 44 mg KOH/g.

Examples of substituents of the compound represented by Chemical Formula 1 are described below, however, the substituents are not limited thereto.

In the present specification,

means a site bonding to other substituents or bonding sites.

In the present specification, the term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term "substituted or unsubstituted" means being substituted with one, two or more substituents selected from the group consisting of deuterium; a halogen group; a nitrile group; a nitro group; an imide group; an amide group; a carbonyl group; an ester group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted amine group; a substituted or unsubstituted phosphine oxide group; a substituted or unsubstituted aryl group; and a substituted or unsubstituted heterocyclic group, being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

In the present specification, examples of the halogen group may include fluorine, chlorine, bromine or iodine.

In the present specification, the number of carbon atoms of the ester group is not particularly limited, but is preferably from 1 to 30.

In the present specification, the number of carbon atoms of the imide group is not particularly limited, but is preferably from 1 to 30.

In the present specification, in the amide group, the nitrogen of the amide group may be substituted with hydrogen, a linear, branched or cyclic alkyl group having 1 to 30 carbon atoms, or an aryl group having 6 to 30 carbon atoms.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the alkyl group may be linear or branched, and although not particularly limited thereto, the number of carbon atoms is preferably from 1 to 60. According to one embodiment, the number of carbon atoms of the alkyl group is from 1 to 30. According to another embodiment, the number of carbon atoms of the alkyl group is from 1 to 20. According to another embodiment, the number of carbon atoms of the alkyl group is from 1 to 10. Specific examples of the alkyl group may include a methyl group, an ethyl group, an n-propyl group, an isopropyl group, an n-butyl group, an isobutyl group, a tert-butyl group, an n-pentyl group, an n-hexyl group, an n-heptyl group, an n-octyl group and the like, but are not limited thereto.

In the present specification, the cycloalkyl group is not particularly limited, but preferably has 3 to 60, and according to one embodiment, the number of carbon atoms of the cycloalkyl group is from 3 to 30. According to another embodiment, the number of carbon atoms of the cycloalkyl group is from 3 to 20. According to another embodiment, the number of carbon atoms of the cycloalkyl group is from 3 to 10. Specific examples thereof may include a cyclopropyl group, a cyclobutyl group, a cyclopentyl group, a cyclohexyl group, a cycloheptyl group, a cyclooctyl group and the like, but are not limited thereto.

In the present specification, the alkenyl group may be linear or branched, and although not particularly limited thereto, the number of carbon atoms is preferably from 2 to 60. According to one embodiment, the number of carbon atoms of the alkenyl group is from 2 to 30. According to another embodiment, the number of carbon atoms of the alkenyl group is from 2 to 20. According to another embodiment, the number of carbon atoms of the alkenyl group is from 2 to 10. Specific examples of the alkenyl group preferably include aryl group-substituted alkenyl groups such as a stylbenyl group or a styrenyl group, but are not limited thereto.

In the present specification, the cycloalkenyl group is not particularly limited, but preferably has 3 to 60, and according to one embodiment, the number of carbon atoms of the cycloalkenyl group is from 3 to 30. According to another embodiment, the number of carbon atoms of the cycloalkenyl group is from 3 to 20. According to another embodiment, the number of carbon atoms of the cycloalkenyl group is from 3 to 10. Examples of the cycloalkenyl group preferably include a cyclopentenylene group or a cyclohexenylene group, but are not limited thereto.

In the present specification, the silyl group is a substituent including Si, and having the Si atom directly linked as a radical, and is represented by $-SiR_{104}R_{105}R_{106}$. $R_{104}$ to $R_{106}$ are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group may be $-BR_{100}R_{101}$. $R_{100}$ and $R_{101}$ are the same as or different from each other, and may be each independently selected from the group consisting of hydrogen; deuterium; halogen; a nitrile group; a substituted or unsubstituted monocyclic or polycyclic cycloalkyl group having 3 to 30 carbon atoms; a substituted or unsubstituted linear or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, specific examples of the phosphine oxide group may include a diphenylphosphine oxide group, a dinaphthylphosphine oxide group and the like, but not limited thereto.

In the present specification, the phosphine group means an alkylphosphine group or an arylphosphine group, and the alkylphosphine group means a phosphine group substituted with an alkyl group. The number of carbon atoms of the alkylphosphine group is not particularly limited, but is preferably from 1 to 20. Examples of the alkylphosphine group may include a dimethylphosphine group, a diethylphosphine group, a di-n-propylphosphine group, a diisopropylphosphine group, a di-n-butylphosphine group, a di-sec-butylphosphine group, a di-tert-butylphosphine group, a diisobutylphosphine group, a tert-butylisopropylphosphine group, a di-n-hexylphosphine group, a di-n-octylphosphine group, a di-n-mesylphosphine group and the like, but are not limited thereto. The arylphosphine group means a phosphine group substituted with an aryl group. The number of carbon atoms of the arylphosphine group is not particularly limited, but is preferably from 6 to 30. Examples of the arylphosphine group may include a diphenylphosphine group, a dibenzylphosphine group, a methylphenylphosphine group, a benzylhexylphosphine group, a bistrimethylsilylphosphine group and the like, but are not limited thereto.

In the present specification, the sulfonyl group is not particularly limited, but may have 1 to 30 carbon atoms. Examples of the sulfonyl group may include alkylsulfonyl having 1 to 4 carbon atoms such as methanesulfonyl, ethanesulfonyl or hexanesulfonyl, and the like, but are not limited thereto.

In the present specification, the amine group means monovalent amine in which at least one hydrogen atom of the amino group ($-NH_2$) is substituted with another substituent, and is represented by $-NR_{107}R_{108}$. $R_{107}$ and $R_{108}$ are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group (however, at least one of $R_{107}$ and $R_{108}$ is not hydrogen). For example, the amine group may be selected from the group consisting of —NH$_2$; a monoalkylamine group; a dialkylamine group; an N-alkylarylamine group; a monoarylamine group; a diarylamine group; an N-arylheteroarylamine group; an N-alkylheteroarylamine group, a monoheteroarylamine group and a diheteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenyltolylamine group, a triphenylamine group, an N-phenylbiphenylamine group; an N-phenylnaphthylamine group; an N-biphenylnaphthylamine group; an N-naphthylfluorenylamine group; an N-phenylphenanthrenylamine group; an N-biphenylphenanthrenylamine group; an N-phenylfluorenylamine group; an N-phenylterphenylamine group; an N-phenanthrenylfluorenylamine group; an N-biphenylfluorenylamine group and the like, but are not limited thereto.

In the present specification, the aryl group is not particularly limited, but preferably has 6 to 60 carbon atoms, and may be a monocyclic aryl group or a polycyclic aryl group. According to one embodiment, the number of carbon atoms of the aryl group is from 6 to 30. According to one embodiment, the number of carbon atoms of the aryl group is from 6 to 20. Examples of the monocyclic aryl group may include a phenyl group, a biphenyl group, a terphenyl group and the like, but are not limited thereto. Examples of the polycyclic aryl group may include a naphthyl group, an anthracenyl group, an indenyl group, a phenanthrenyl group, a pyrenyl group, a perylenyl group, a triphenyl group, a chrysenyl group, a fluorenyl group and the like, but are not limited thereto.

In the present specification, the heteroaryl group is a heterocyclic group including one or more of N, O, S, Si and Se as a heteroatom, and although not particularly limited thereto, the number of carbon atoms is preferably from 2 to 50. Examples of the heteroaryl group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a dibenzofuranyl group and the like, but are not limited thereto.

In the present specification, the alkylene oxide group may be represented by —(R—O)m-R—. R is an alkyl group, and the alkyl group may employ the descriptions provided above. The number of carbon atoms of the alkylene oxide group is not particularly limited, but may be from 2 to 40, or from 2 to 33. Examples of the alkylene oxide group may include ethylene oxide, propylene oxide and the like, but are not limited thereto. Specifically, the alkylene oxide group may include compounds of the following structural formulae, but is not limited thereto.

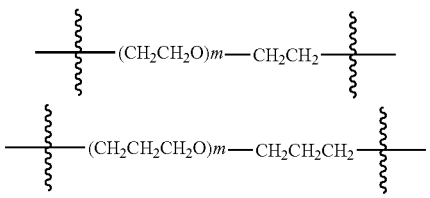

In the structural formulae, m is an integer of 1 to 10.

In the present specification, the alkylene group means alkane having two bonding sites. The alkylene group may be linear, branched or cyclic. The number of carbon atoms of the alkylene group is not particularly limited, but, for example, may be from 1 to 30, specifically form 1 to 20, and more specifically from 1 to 10. In one embodiment, the number of carbon groups of the alkylene group may be from 1 to 3.

In the present specification, the cycloalkylene group means cycloalkane having two bonding sites. Descriptions on the cycloalkyl group provided above may be applied thereto except for those being each divalent.

In the present specification, the cycloalkenylene group means the cycloalkenyl group having two bonding sites, that is, a divalent group. Descriptions on the cycloalkenyl group provided above may be applied thereto except for those being each divalent.

In the present specification, the arylene group means the aryl group having two bonding sites, that is, a divalent group. Descriptions on the aryl group provided above may be applied thereto except for those being each divalent.

In one embodiment of the present specification, R1 and R2 are hydrogen or represented by Chemical Formula 2, and at least one of R1 and R2 is represented by Chemical Formula 2.

In one embodiment of the present specification, R1 and R2 are represented by Chemical Formula 2.

In one embodiment of the present specification, R1 is hydrogen, and R2 is represented by Chemical Formula 2.

In one embodiment of the present specification, n is an integer of 1 to 50.

In one embodiment of the present specification, n is an integer of 1 to 20.

In one embodiment of the present specification, n is an integer of 1 to 10.

In one embodiment of the present specification, n is an integer of 3 to 8.

In one embodiment of the present specification, the cardo-based binder resin may be a mixture of the compounds represented by Chemical Formula 1. Specifically, the cardo-based binder resin may be a mixture of the compounds of Chemical Formula 1 in which n is an integer of 3 to 8.

In one embodiment of the present specification, X1 to X6 are a substituted or unsubstituted alkylene group having 1 to 3 carbon atoms; or a substituted or unsubstituted alkylene oxide group having 2 to 10 carbon atoms, and Y1 and Y2 are selected from the group consisting of a substituted or unsubstituted alkylene group having 1 to 10 carbon atoms; a substituted or unsubstituted cycloalkylene group having 3 to 10 carbon atoms; a substituted or unsubstituted cycloalkenylene group having 3 to 10 carbon atoms; and a substituted or unsubstituted arylene group having 6 to 20 carbon atoms.

In one embodiment of the present specification, X1 to X6 are a substituted or unsubstituted alkylene group having 1 to 30 carbon atoms; or a substituted or unsubstituted alkylene oxide group having 2 to 20 carbon atoms.

In one embodiment of the present specification, X1 to X6 are a substituted or unsubstituted alkylene group having 1 to 20 carbon atoms; or a substituted or unsubstituted alkylene oxide group having 2 to 10 carbon atoms.

In one embodiment of the present specification, X1 to X6 are a substituted or unsubstituted alkylene group having 1 to 10 carbon atoms; or a substituted or unsubstituted alkylene oxide group having 2 to 10 carbon atoms.

In one embodiment of the present specification, X1 to X6 are a substituted or unsubstituted alkylene group having 1 to 3 carbon atoms; or a substituted or unsubstituted alkylene oxide group having 2 to 10 carbon atoms.

In one embodiment of the present specification, X1 to X6 are a substituted or unsubstituted methylene group; a substituted or unsubstituted ethylene oxide group; or a substituted or unsubstituted propylene oxide group.

In one embodiment of the present specification, X1 to X6 are a methylene group.

In one embodiment of the present specification, Y1 and Y2 are selected from the group consisting of a substituted or unsubstituted alkylene group having 1 to 30 carbon atoms; a substituted or unsubstituted cycloalkylene group having 3 to 30 carbon atoms; a substituted or unsubstituted cycloalkenylene group having 3 to 30 carbon atoms; and a substituted or unsubstituted arylene group having 6 to 30 carbon atoms.

In one embodiment of the present specification, Y1 and Y2 are selected from the group consisting of a substituted or unsubstituted alkylene group having 1 to 20 carbon atoms; a substituted or unsubstituted cycloalkylene group having 3 to 20 carbon atoms; a substituted or unsubstituted cycloalkenylene group having 3 to 20 carbon atoms; and a substituted or unsubstituted arylene group having 6 to 20 carbon atoms.

In one embodiment of the present specification, Y1 and Y2 are selected from the group consisting of a substituted or unsubstituted alkylene group having 1 to 10 carbon atoms; a substituted or unsubstituted cycloalkylene group having 3 to 10 carbon atoms; a substituted or unsubstituted cycloalkenylene group having 3 to 10 carbon atoms; and a substituted or unsubstituted arylene group having 6 to 20 carbon atoms.

In one embodiment of the present specification, Y1 and Y2 are a substituted or unsubstituted cyclohexylene group; a substituted or unsubstituted cyclohexenylene group; or a substituted or unsubstituted phenylene group.

In one embodiment of the present specification, Y1 and Y2 are a substituted or unsubstituted cyclohexenylene group.

In one embodiment of the present specification, Y1 and Y2 are a cyclohexenylene group.

In one embodiment of the present specification, R3 to R5 are the same as or different from each other, and each independently hydrogen; or a substituted or unsubstituted alkyl group having 1 to 30 carbon atoms.

In one embodiment of the present specification, R3 to R5 are the same as or different from each other, and each independently hydrogen; or a substituted or unsubstituted alkyl group having 1 to 20 carbon atoms.

In one embodiment of the present specification, R3 to R5 are the same as or different from each other, and each independently hydrogen; or a substituted or unsubstituted alkyl group having 1 to 10 carbon atoms.

In one embodiment of the present specification, R3 to R5 are the same as or different from each other, and each independently hydrogen; or a substituted or unsubstituted methyl group.

In one embodiment of the present specification, R3 to R5 are the same as or different from each other, and each independently hydrogen; or a methyl group.

In one embodiment of the present specification, R3 is a methyl group.

In one embodiment of the present specification, R4 is hydrogen.

In one embodiment of the present specification, R5 is hydrogen.

In one embodiment of the present specification, A1 to A4 are the same as or different from each other, and each independently selected from the group consisting of hydrogen; deuterium; a halogen group; a nitrile group; a nitro group; a hydroxyl group; an ester group; an imide group; an amide group; a substituted or unsubstituted alkoxy group; a substituted or unsubstituted alkyl group; a substituted or unsubstituted cycloalkyl group; a substituted or unsubstituted alkenyl group; a substituted or unsubstituted cycloalkenyl group; a substituted or unsubstituted silyl group; a substituted or unsubstituted boron group; a substituted or unsubstituted phosphine oxide group; a substituted or unsubstituted phosphine group; a substituted or unsubstituted sulfonyl group; a substituted or unsubstituted amine group; a substituted or unsubstituted aryl group; and a substituted or unsubstituted heteroaryl group.

In one embodiment of the present specification, A1 to A4 are hydrogen.

In one embodiment of the present specification, a1 to a4 are an integer of 0 to 4, and when a1 to a4 are 2 or greater, structures in the parentheses ( ) are the same as or different from each other.

In one embodiment of the present specification, a1 is an integer of 0 to 4.

In one embodiment of the present specification, a2 is an integer of 0 to 4.

In one embodiment of the present specification, a3 is an integer of 0 to 4.

In one embodiment of the present specification, a4 is an integer of 0 to 4.

In one embodiment of the present specification, Chemical Formula 1 may be represented by the following Chemical Formula 1-1.

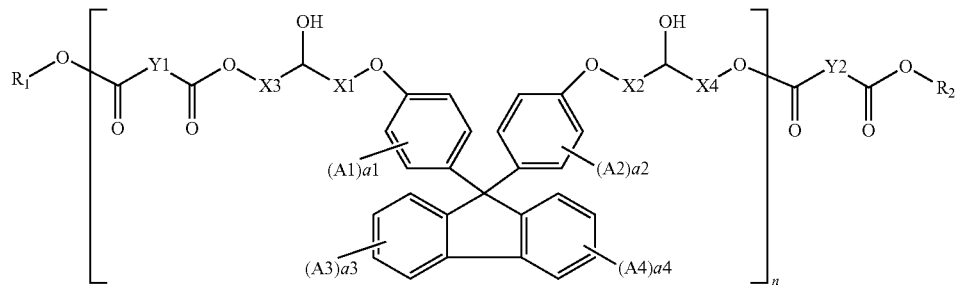

[Chemical Formula 1-1]

wherein, in Chemical Formula 1-1,
R1, R2, n, X1 to X4, Y1, Y2, A1 to A4 and a1 to a4 have the same definitions as in Chemical Formula 1.

In one embodiment of the present specification, Chemical Formula 1 may be represented by the following Chemical Formula 3 or the following Chemical Formula 4.

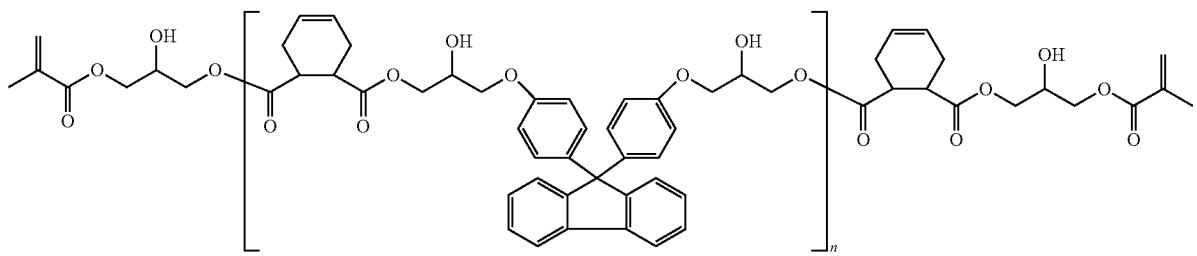

[Chemical Formula 3]

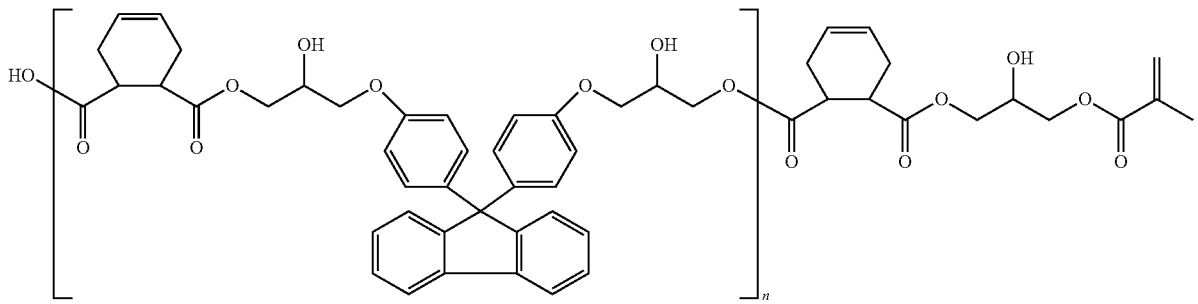

[Chemical Formula 4]

wherein, in Chemical Formula 3 and Chemical Formula 4, n has the same definition as in Chemical Formula 1.

In one embodiment of the present specification, the cardo-based binder resin has a weight average molecular weight of 1,000 g/mol to 10,000 g/mol. Preferably, the weight average molecular weight may be from 2,000 g/mol to 4,000 g/mol.

One embodiment of the present specification provides a photosensitive resin composition comprising the cardo-based binder resin.

In One embodiment of the present specification, the photosensitive resin composition further comprises a colorant; a multifunctional monomer; a photoinitiator and a solvent.

In one embodiment of the present specification, the photosensitive resin composition further comprises one or more types selected from among an acryl-based binder resin; an adhesion promoter; and a leveling agent.

In one embodiment of the present specification, the photosensitive resin composition comprises, based on 100 parts by weight of the photosensitive resin composition, the cardo-based binder resin in 0.5 parts by weight to 10 parts by weight, the colorant in 1 parts by weight to 50 parts by weight, the acryl-based binder resin in 0 parts by weight to 10 parts by weight, the multifunctional monomer in 1 parts by weight to 20 parts by weight, the photoinitiator in 0.1 parts by weight to 10 parts by weight, the adhesion promoter in 0.01 parts by weight to 5 parts by weight, the leveling agent in 0.01 parts by weight to 5 parts by weight, and the solvent in 20 parts by weight to 95 parts by weight.

In one embodiment of the present specification, the colorant may include carbon black as a black pigment, and may include a carbon black dispersion in a dispersion form. In another embodiment, the colorant may use carbon black alone, or, as necessary, may further mix one, two or more types from organic pigments such as red pigments, yellow pigments, blue pigments or violet pigments thereto. Herein, since a coloring pigment lacking light shielding properties is mixed thereto, there is an advantage in that film strength or adhesion to a substrate does not decline even when the amount of the colorant relatively increases.

The carbon black dispersion means solid carbon black being dissolved in an organic solvent by a dispersant. Pigments commercially available in a dispersion form may be used, and for example, BK_5075 of Tokushiki Co., Ltd. may be used, however, the carbon black dispersion is not limited thereto.

In one embodiment of the present specification, the acryl-based binder resin is not particularly limited as long as it is capable of exhibiting properties such as strength of a film prepared with the resin composition, and developability.

As the acryl-based binder resin, a copolymerized resin of a multifunctional monomer providing mechanical strength and a monomer providing alkali solubility may be used, and the binder resin may further include binders generally used in the art.

In one embodiment of the present specification, the acryl-based binder resin may be a resin polymer comprising styrene/FA-513M and a reactive group.

The multifunctional monomer providing mechanical strength of the film may be any one or more of unsaturated carboxylic acid esters; aromatic vinyls; unsaturated ethers; unsaturated imides; and acid anhydrides.

Specific examples of the unsaturated carboxylic acid esters may be selected from the group consisting of benzyl (meth)acrylate, methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, isobornyl (meth)acrylate, ethylhexyl (meth)acrylate, 2-phenoxyethyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, acyloctyloxy-2-hydroxypropyl (meth)acrylate, glycerol (meth)acrylate, 2-methoxyethyl (meth)acrylate, 3-methoxybutyl (meth)acrylate, ethoxydiethylene glycol (meth)acrylate, methoxytriethylene glycol (meth)acrylate, methoxytripropylene glycol (meth)acrylate, poly(ethylene glycol) methyl ether (meth)acrylate, phenoxydiethylene glycol (meth)acrylate, p-nonylphenoxy polyethylene glycol (meth)acrylate, p-nonylphenoxy polypropylene glycol (meth)acrylate, glycidyl (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, methyl α-hydroxymethyl acrylate, ethyl α-hydroxymethyl acrylate, propyl α-hydroxymethyl acrylate and butyl α-hydroxymethyl acrylate, but are not limited thereto.

Specific examples of the aromatic vinyls may be selected from the group consisting of styrene, α-methylstyrene, (o,m,p)-vinyl toluene, (o,m,p)-methoxystyrene and (o,m,p)-chlorostyrene, but are not limited thereto.

Specific examples of the unsaturated ethers may be selected from the group consisting of vinyl methyl ether, vinyl ethyl ether and allyl glycidyl ether, but are not limited thereto.

Specific examples of the unsaturated imides may be selected from the group consisting of N-phenylmaleimide, N-(4-chlorophenyl) maleimide, N-(4-hydroxyphenyl) maleimide and N-cyclohexylmaleimide, but are not limited thereto.

Examples of the acid anhydride may include maleic anhydride, methyl maleic anhydride, tetrahydrophthalic anhydride and the like, but are not limited thereto.

The monomer providing alkali solubility is not particularly limited as long as it includes an acid group, and using one or more types selected from the group consisting of, for example, (meth)acrylic acid, crotonic acid, itaconic acid, maleic acid, fumaric acid, monomethyl maleic acid, 5-norbornene-2-carboxylic acid, mono-2-((meth)acryloyloxy) ethyl phthalate, mono-2-((meth)acryloyloxy)ethyl succinate and ω-carboxypolycarprolactone mono(meth)acrylate is preferred, however, the monomer is not limited thereto.

According to one embodiment of the present specification, the acryl-based binder resin has an acid value of 50 mgKOH/g to 130 mgKOH/g and a weight average molecular weight of 1,000 g/mol to 50,000 g/mol.

In another embodiment, the acryl-based binder resin has an acid value of 50 mgKOH/g to 100 mgKOH/g and a weight average molecular weight of 2,000 g/mol to 40,000 g/mol.

In one embodiment of the present specification, the acryl-based binder resin may be prepared by mixing benzyl (meth)acrylate, styrene and N-phenylmaleimide with (meth)acrylic acid, 3-mercaptopropionic acid that is a chain transfer agent, and acetic acid 3-methoxy ester that is a solvent.

In another embodiment of the present specification, the acryl-based binder resin may be prepared by, after mixing benzyl (meth)acrylate, (meth)acrylic acid, 3-mercaptopropionic acid that is a chain transfer agent, and acetic acid 3-methoxy ester that is a solvent, further mixing tetrabutylammonium bromide and glycidyl (meth)acrylate thereto.

In one embodiment of the present specification, the photoinitiator is not particularly limited as long as it is an initiator generating radicals by light and promoting crosslinkage, and examples thereof may include one or more types selected from the group consisting of acetophenone-based compounds, biimidazole-based compounds, triazine-based compounds and oxime-based compounds.

Examples of the acetophenone-based compound may include 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexylphenyl ketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one, 2-methyl-1-[4-(methylthio)phenyl]-2-morpholinopropan-1-one or the like, but are not limited thereto.

Examples of the biimidazole-based compound may include 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, 2,2'-bis(o-chlorophenyl)-4,4,5,5'-tetraphenyl-1,2'-biimidazole and the like, but are not limited thereto.

Examples of the triazine-based compound may include 3-{4-[2,4-bis(trichloramethyl)-s-triazin-6-yl]phenylthio}propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-triazin-6-yl]phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3- butadienyl-s-triazine, 2-trichloromethyl-4-amino-6-p-methoxystyryl-s-triazine and the like, but are not limited thereto.

Examples of the oxime-based compound may include 1,2-octadione-1-(4-phenylthio)phenyl-2-(o-benzoyloxime) (Ciba-Geigy, CGI 124), ethanone-1-(9-ethyl)-6-(2-methyl-benzoyl-3-yl)-1-(o-acetyloxime) (CGI 242), N-1919 (Adeka Corporation) and the like, but are not limited thereto.

In one embodiment of the present specification, the photoinitiator may be Oxe 02 of BASF Corporation.

In one embodiment of the present specification, as the adhesion promoter, one or more types of methacryloyl silane coupling agents such as methacryloyloxy propyltrimethoxysilane, methacryloyloxy propyldimethoxysilane, methacryloyloxy propyltriethoxysilane and methacryloyloxy propyldimethoxysilane may be selected and used, and as alkyl trimethoxysilane, one or more types of octyltrimethoxysilane, dodecyltrimethoxysilane, octadecyltrimethoxysilane and the like may be selected and used.

In one embodiment of the present specification, the leveling agent may be polymeric or non-polymeric. Specific examples of the polymeric leveling agent may include polyethyleneimine, polyamideamine, and reaction products of amine and epoxide, and specific examples of the non-polymeric leveling agent may include non-polymer sulfur-containing and non-polymer nitrogen-containing compounds, but are not limited thereto, and those generally used in the art may all be used. Specifically, commercially available F-475 of DIC Corporation may be used.

In one embodiment of the present specification, the solvent may be one or more selected from the group consisting of propylene glycol monomethyl ether, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, 2-hydroxyethyl propionate, 3-methyl-3-methoxybutyl propionate, ethyl-3-methoxypropionate, methyl-3-ethoxypropionate, ethyl-3-ethoxypropionate, 3-methoxybutyl acetate, amyl formate, isoamyl acetate, isobutyl acetate, butyl propionate, isopropyl butyrate, ethyl butyrate, butyl butyrate, ethyl pyruvate and butyrol acetate.

One embodiment of the present specification provides a black matrix formed using the photosensitive resin composition.

The black matrix may be prepared using a preparation method to describe below.

By coating the photosensitive resin composition on a substrate surface and removing the solvent using pre-bake, a film may be formed. As the coating method, methods of a spray method, a roll coating method, a spin coating method, a bar coating method, a slit coating method and the like may be used. A condition of the pre-bake may vary depending on mixing components and ratio of the composition, however, the pre-bake may be normally performed for 0.5 minutes to 30 minutes at 70° C. to 150° C.

Then, ultraviolet rays are irradiated on the pre-baked coated film through a predetermined pattern mask, and unnecessary parts are removed by developing using an aqueous alkali solution to form a pattern. As the developing method, a dipping method, a shower method or the like may be used without limit. The developing time is normally from 30 seconds to 180 seconds. The developing solution is an aqueous alkali solution, and an aqueous solution of inorganic alkalis such as sodium hydroxide, potassium hydroxide, sodium silicate, sodium metasilicate or ammonia; primary amines such as ethylamine or N-propylamine; secondary amines such as diethylamine or di-n-propylamine; tertiary amines such as trimethylamine, methyldiethylamine or dimethylethylamine; tertiary alcohol amines such as dimethylethanolamine, methyldiethanolamine or triethanolamine; cyclic tertiary amines such as pyrrole, piperidine, n-methylpiperidine, n-methylpyrrolidine, 1,8-diazabicyclo[5.4.0]-7-undecene or 1,5-diazabicyclo[4.3.0]-5-nonene; aromatic tertiary amines such as pyridine, coridine, lutidine or quinoline; and quaternary ammonium salts such as tetramethylammonium hydroxide or tetraethylammonium hydroxide, and the like, may be used.

After development, water washing is performed for approximately 30 seconds to 90 seconds, and the result is dried with air or nitrogen to form a pattern. This pattern goes through post-bake using a heating device such as a hot plate or an oven to obtain a completed black matrix. Herein, as for a condition of the post-bake, heating for approximately 10 minutes to 90 minutes at 150° C. to 230° C. is preferred.

The substrate may be a glass plate, a silicon wafer, and a plate made of a plastic base such as polyethersulfone (PES) or polycarbonate (PC), and the type is not particularly limited.

One embodiment of the present specification provides a color filter comprising the black matrix.

The color filter may further comprise a red pattern, a green pattern or a blue pattern as necessary.

According to another embodiment, the color filter may further comprise an overcoat layer.

With intent to enhance contrast, a grid black pattern referred to as a black matrix may be disposed between color pixels of the color filter.

One embodiment of the present specification provides a display apparatus comprising the black matrix.

The display apparatus may have constitutions known in the art except for comprising the above-described black matrix.

Hereinafter, the present specification will be described in detail with reference to examples. However, the following examples are for illustrative purposes only, and the scope of the present specification includes the scope described in the appended claims, and substitutions and modifications thereof, and is not limited to the scope of the examples.

PREPARATION EXAMPLE

Synthesis Example 1

In a 500 mL three-neck flask, 9,9-bisphenol fluorene diglycidyl ether (BPFG) (89 g, 0.19 mol), 4-cyclohexene-1,2-dicarboxylic acid (CDA) (51 g, 0.30 mol) and tetrabutylammonium bromide (TBAB) (1.4 g) were stirred together with propylene glycol methyl ether acetate (PGMEA) (260 g).

Under the nitrogen atmosphere, the reaction mixture was heated to 120° C., and stirred for 24 hours. After cooling the reaction mixture to 80° C., inside the reactor was substituted with air, and after adding a polymerization inhibitor (BHT) (0.08 g) thereto, the result was stirred for 1 hour.

After adding glycidyl methacrylate (GMA) (29.6 g, 0.21 mol) and propylene glycol methyl ether acetate (PGMEA) (29.6 g) to the reaction mixture, the result was stirred for 24 hours at 120° C.

A cardo-based binder resin obtained in Synthesis Example 1 is represented by the following Chemical Formula 3.

[Chemical Formula 3]

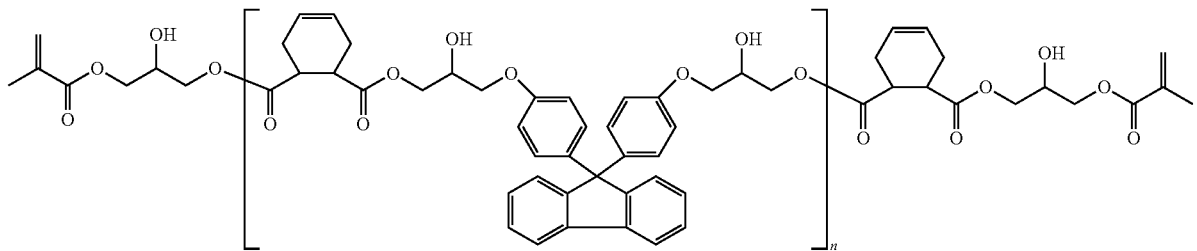

wherein, in Chemical Formula 3, n is from 3 to 8. The cardo-based binder resin has a mixture form of the compound represented by Chemical Formula 3 in which n is in the above-mentioned range.

In the prepared cardo-based binder resin, the solid content was 40.0%, the acid value was 0 mgKOH/g, and the weight average molecular weight was 3,040 g/mol.

Synthesis Example 2

A cardo-based binder resin was synthesized in the same manner as in Synthesis Example 1 except that 22.2 g (0.16 mol) of the glycidyl methacrylate and 22.2 g of the propylene glycol methyl ether acetate were used.

The cardo-based binder resin obtained in Synthesis Example 2 was a mixture of a compound represented by the following Chemical Formula 3, a compound represented by the following Chemical Formula 4 and a compound represented by the following Chemical Formula 5.

[Chemical Formula 3]

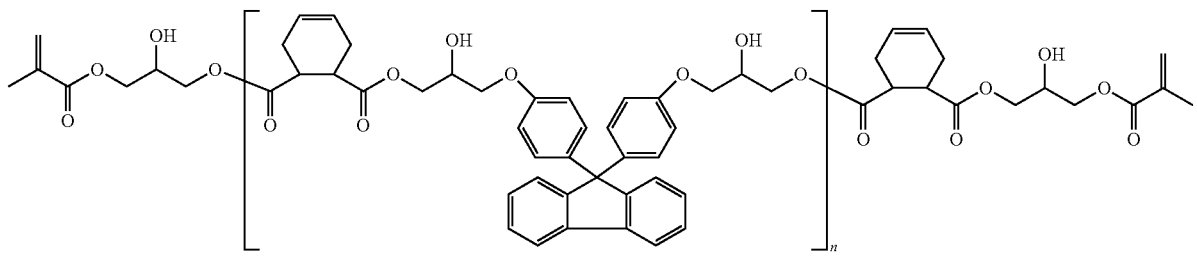

[Chemical Formula 4]

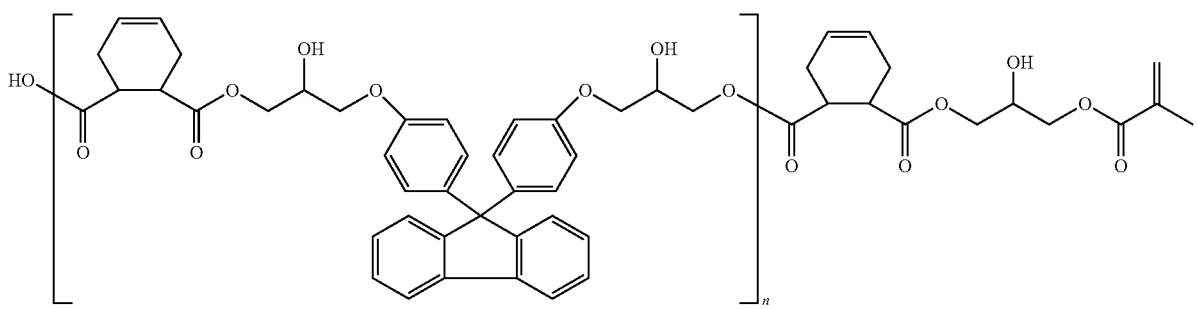

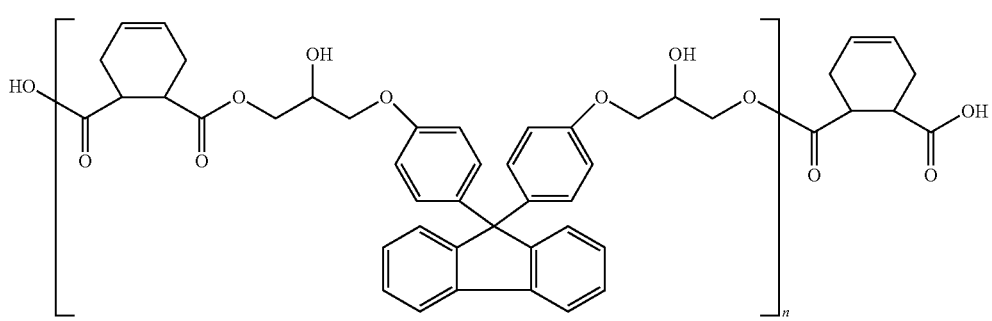

[Chemical Formula 5]

wherein, in Chemical Formula 3 to Chemical Formula 5, n is from 3 to 8. The cardo-based binder resin has a mixture form of the compound represented by Chemical Formula 3 in which n is in the above-mentioned range, the compound represented by Chemical Formula 4 in which n is in the above-mentioned range and the compound represented by Chemical Formula 5 in which n is in the above-mentioned range.

In the prepared cardo-based binder resin, the solid content was 39.4%, the acid value was 28 mgKOH/g, and the weight average molecular weight was 2,940 g/mol.

Synthesis Example 3

A cardo-based binder resin was synthesized in the same manner as in Synthesis Example 1 except that 14.8 g (0.10 mol) of the glycidyl methacrylate and 14.8 g of the propylene glycol methyl ether acetate were used.

The cardo-based binder resin obtained in Synthesis Example 3 was a mixture of the compound represented by Chemical Formula 3, the compound represented by Chemical Formula 4 and the compound represented by Chemical Formula 5.

In Chemical Formula 3 to Chemical Formula 5, n is from 3 to 8. The cardo-based binder resin has a mixture form of the compound represented by Chemical Formula 3 in which n is in the above-mentioned range, the compound represented by Chemical Formula 4 in which n is in the above-mentioned range and the compound represented by Chemical Formula 5 in which n is in the above-mentioned range.

In the prepared cardo-based binder resin, the solid content was 38.2%, the acid value was 44 mgKOH/g, and the weight average molecular weight was 2,890 g/mol.

Comparative Synthesis Example 1

In a 500 mL three-neck flask, 9,9-bisphenol fluorene diglycidyl ether (89 g, 0.19 mol), 4-cyclohexene-1,2-dicarboxylic acid (51 g, 0.30 mol) and tetrabutylammonium bromide (1.4 g) were stirred together with propylene glycol methyl ether acetate (260 g). Under the nitrogen atmosphere, the reaction mixture was heated to 120° C., and stirred for 24 hours. After cooling the reaction mixture to room temperature, the reaction was terminated. A binder resin prepared in Comparative Synthesis Example 1 is represented by the following Chemical Formula 5.

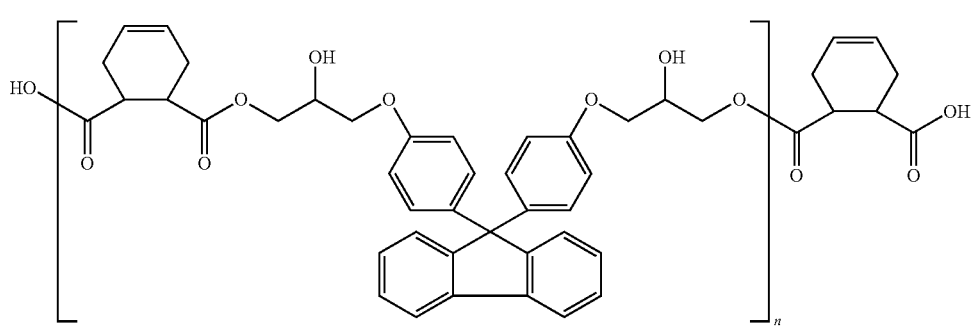

[Chemical Formula 5]

wherein, in Chemical Formula 5, n is from 3 to 8. The cardo-based binder resin has a mixture form of the compound represented by Chemical Formula 5 in which n is in the above-mentioned range.

In the prepared binder resin, the solid content was 33.9%, the acid value was 86 mgKOH/g, and the weight average molecular weight was 2,700 g/mol.

Comparative Synthesis Example 2

In a 500 mL three-neck flask, 9,9-bisphenol fluorene diglycidyl ether (BPFG) (89 g, 0.19 mol), 4-cyclohexene-1,2-dicarboxylic acid (CDA) (51 g, 0.30 mol) and tetrabutylammonium bromide (TBAB) (1.4 g) were stirred together with propylene glycol methyl ether acetate (PGMEA) (260 g). Under the nitrogen atmosphere, the reaction mixture was heated to 120° C., and stirred for 24 hours. After cooling the reaction mixture to 80° C., inside the reactor was substituted with air, and after adding a polymerization inhibitor (BHT) (0.08 g) thereto, the result was stirred for 1 hour. After adding methacryloyloxyethyl isocyanate (MOI) (32.2 g, 0.21 mol) and propylene glycol methyl ether acetate (PGMEA) (32.2 g) to the reaction mixture, the result was stirred for 24 hours at 80° C. A binder resin prepared in Comparative Synthesis Example 2 is represented by the following Chemical Formula 6.

[Chemical Formula 6]

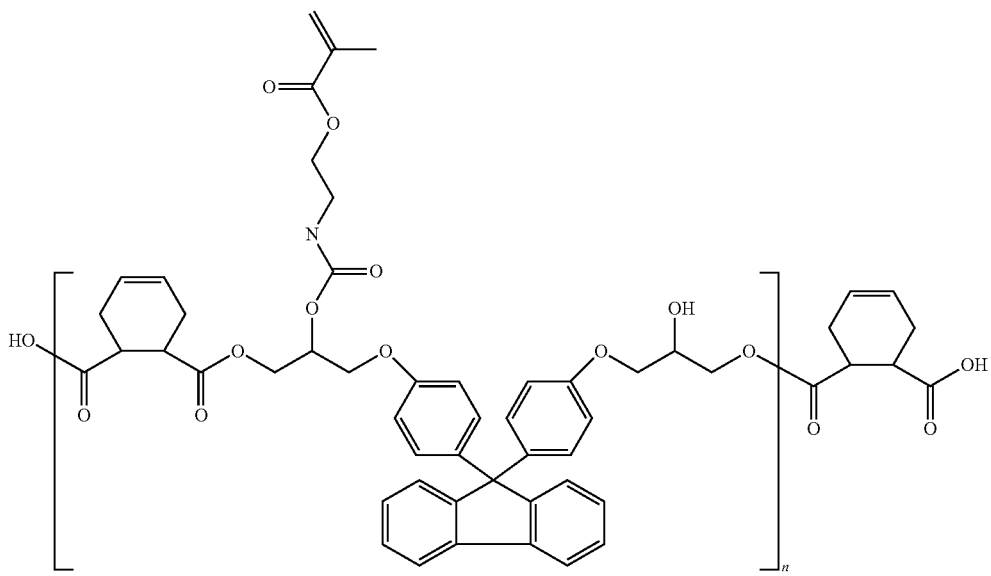

wherein, in Chemical Formula 6, n is from 3 to 8. The cardo-based binder resin has a mixture form of the compound represented by Chemical Formula 6 in which n is in the above-mentioned range.

In the prepared binder resin, the solid content was 40.8%, the acid value was 69 mgKOH/g, and the weight average molecular weight was 2,890 g/mol.

Comparative Synthesis Example 3

In a 500 mL three-neck flask, 9,9-bisphenol fluorene diglycidyl ether (BPFG) (89 g, 0.19 mol), 4-cyclohexene-1,2-dicarboxylic acid (CDA) (51 g, 0.30 mol) and tetrabutylammonium bromide (TBAB) (1.4 g) were stirred together with propylene glycol methyl ether acetate (PGMEA) (260 g). Under the nitrogen atmosphere, the reaction mixture was heated to 120° C., and stirred for 24 hours. After cooling the reaction mixture to 80° C., inside the reactor was substituted with air, and after adding a polymerization inhibitor (BHT) (0.08 g) thereto, the result was stirred for 1 hour. After adding acryloyloxyethyl isocyanate (AOI) (29.3 g, 0.21 mol) and propylene glycol methyl ether acetate (PGMEA) (29.3 g) to the reaction mixture, the result was stirred for 24 hours at 80° C. A binder resin prepared in Comparative Synthesis Example 3 is represented by the following Chemical Formula 7.

[Chemical Formula 7]

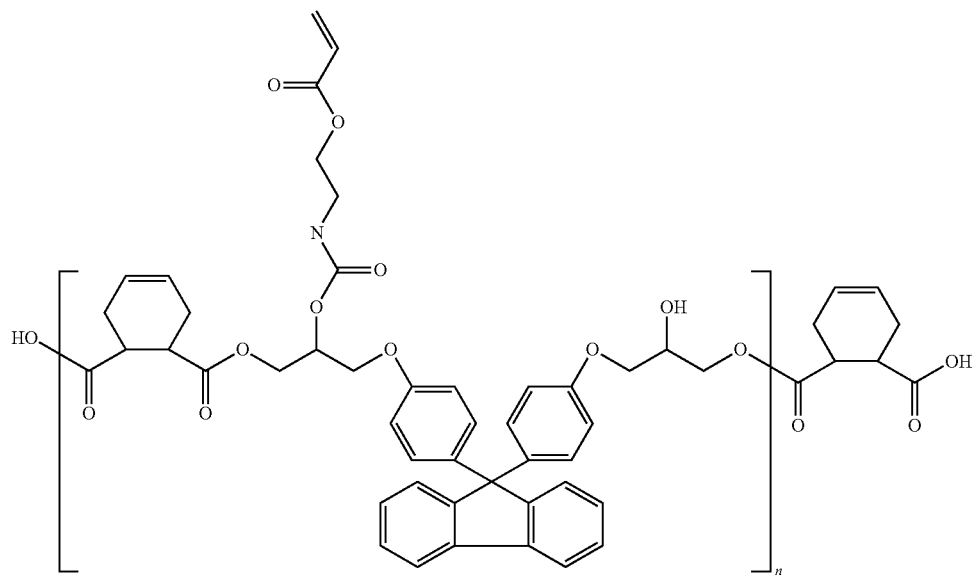

wherein, in Chemical Formula 7, n is from 3 to 8. The cardo-based binder resin has a mixture form of the compound represented by Chemical Formula 7 in which n is in the above-mentioned range.

In the prepared binder resin, the solid content was 40.2%, the acid value was 72 mgKOH/g, and the weight average molecular weight was 2,810 g/mol.

Comparative Synthesis Example 4

In a 500 mL three-neck flask, 9,9-bisphenol fluorene epoxy acrylate (BPFE) (100.6 g, 0.17 mol), isophorone diisocyanate (IPDI) (19.4 g, 0.09 mol) and tetrabutylammonium bromide (TBAB) (0.8 g) were stirred together with propylene glycol methyl ether acetate (PGMEA) (180 g). The reaction mixture was heated to 120° C., and reacted for 24 hours to produce urethane bonds. After cooling the reaction mixture to room temperature, the reaction was terminated. A binder resin prepared in Comparative Synthesis Example 4 is represented by the following Chemical Formula 8.

[Chemical Formula 8]

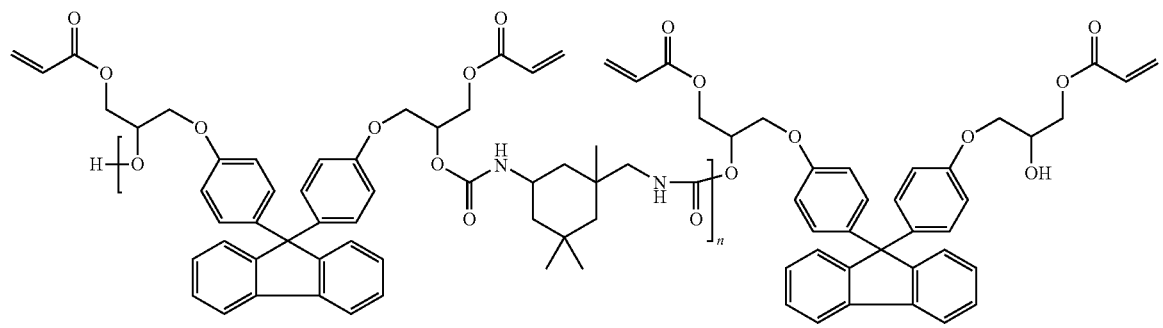

wherein, in Chemical Formula 8, n is from 3 to 8. The cardo-based binder resin has a mixture form of the compound represented by Chemical Formula 8 in which n is in the above-mentioned range.

In the prepared binder resin, the solid content was 33.6%, the acid value was 0 mgKOH/g, and the weight average molecular weight was 2,660 g/mol.

Comparative Synthesis Example 5

In a 500 mL three-neck flask, 9,9-bisphenol fluorene epoxy acrylate (BPFE) (100.6 g, 0.17 mol), isophorone diisocyanate (IPDI) (19.4 g, 0.09 mol) and tetrabutylammonium bromide (TBAB) (0.8 g) were stirred together with propylene glycol methyl ether acetate (PGMEA) (180 g). The reaction mixture was heated to 120° C., and reacted for 24 hours to produce urethane bonds. After cooling the reaction mixture to 90° C., tetrahydrophthalic anhydride (THPA) (13.9 g) and propylene glycol methyl ether acetate (PGMEA) (11.5 g) were added thereto, and the result was further reacted for 12 hours at 90° C. to synthesize a cardo-based resin including an acid group. A binder resin prepared in Comparative Synthesis Example 5 is represented by the following Chemical Formula 9.

[Chemical Formula 9]

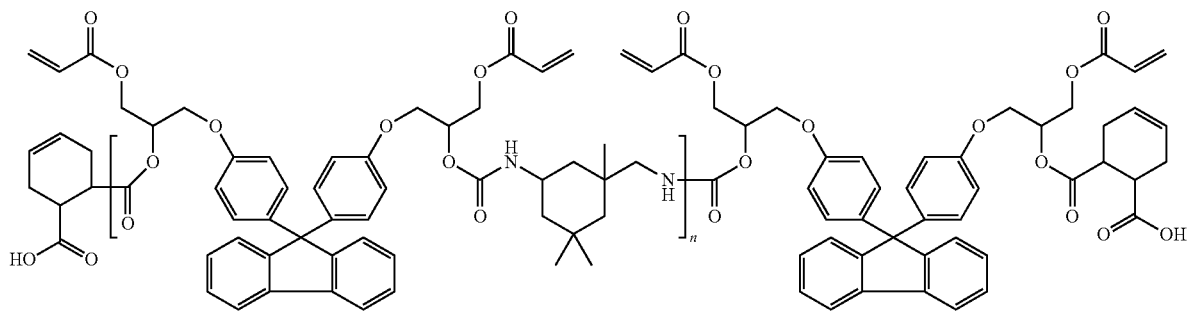

wherein, in Chemical Formula 9, n is from 3 to 8. The cardo-based binder resin has a mixture form of the compound represented by Chemical Formula 9 in which n is in the above-mentioned range.

In the prepared binder resin, the solid content was 29.5%, the acid value was 40 mgKOH/g, and the weight average molecular weight was 2,920 g/mol.

The compositions included in the preparation examples are summarized and described in the following Table 1.

TABLE 1

| | Preparation Step 1 | | | | | | Preparation Step 2 | | | | | |
|---|---|---|---|---|---|---|---|---|---|---|---|---|
| | BPFG (g) | BPFE (g) | CDA (g) | IPDI (g) | TBAB (g) | PGMEA (g) | BHT (g) | GMA (g) | MOI (g) | AOI (g) | THPA (g) | PGEMA (g) |
| Synthesis Example 1 | 89 | — | 51 | — | 1.4 | 260 | 0.08 | 29.6 | — | — | — | 29.6 |
| Synthesis Example 2 | 89 | — | 51 | — | 1.4 | 260 | 0.08 | 22.2 | — | — | — | 22.2 |
| Synthesis Example 3 | 89 | — | 51 | — | 1.4 | 260 | 0.08 | 14.8 | — | — | — | 14.8 |
| Comparative Synthesis Example 1 | 89 | — | 51 | — | 1.4 | 260 | — | — | — | — | — | — |

TABLE 1-continued

| | Preparation Step 1 | | | | | | Preparation Step 2 | | | | | |
|---|---|---|---|---|---|---|---|---|---|---|---|---|
| | BPFG (g) | BPFE (g) | CDA (g) | IPDI (g) | TBAB (g) | PGMEA (g) | BHT (g) | GMA (g) | MOI (g) | AOI (g) | THPA (g) | PGEMA (g) |
| Comparative Synthesis Example 2 | 89 | — | 51 | — | 1.4 | 260 | 0.08 | — | 32.2 | — | — | 32.2 |
| Comparative Synthesis Example 3 | 89 | — | 51 | — | 1.4 | 260 | 0.08 | — | — | 29.3 | — | 29.3 |
| Comparative Synthesis Example 4 | — | 100.6 | — | 19.4 | 0.8 | 180 | — | — | — | — | — | — |
| Comparative Synthesis Example 5 | — | 100.6 | — | 19.4 | 0.8 | 180 | — | — | — | — | 13.9 | 11.5 |

In Table 1, BPFG means 9,9-bis(4-glycidyloxyphenyl)fluorine, BPFE means 9.9-bis[4-(2-hydroxy-3-acryloyloxypropoxy)phenyl]fluorine, CDA means 4-cyclohexene-1,2-dicarboxylic acid, IPDI means isophorone diisocyanate, TBAB means tetrabutylammomium bromide, PGMEA means propylene glycol monomethyl ether acetate, BHT means 2,6-di-tert-butyl-4-methylphenol, MOI means 2-methacryloyloxyethyl isocyanate, AOI means 2-acryloyloxyethyl isocyanate, THPA means 1,2,3,6-tetrahydrophthalic anhydride, and GMA means glycidyl methacrylate.

Example 1

Based on 100 parts by weight of a photosensitive resin composition, 35 parts by weight of a carbon black dispersion (Tokushiki Co., Ltd. BK 5075 content 15%), 5 parts by weight of the binder resin synthesized in Synthesis Example 1 (Mw=3040 g/mol, acid value=0 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane (KBM-503) as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 μm to 3.0 μm. Then, the result was cooled at room temperature, and exposed using a photomask with energy of 30 mJ/cm² to 100 mJ/cm² under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 μm to 3.0 μm was able to be secured at mask transmittance of 100%, and a favorable pattern having a film thickness of 1.0 μm to 2.5 μm was able to be secured at mask transmittance of 10% or less.

Example 2

Based on 100 parts by weight of a photosensitive resin composition, 35 parts by weight of a carbon black dispersion (Tokushiki Co., Ltd. BK_5075 content 15%), 5 parts by weight of the binder resin synthesized in Synthesis Example 2 (Mw=2940 g/mol, acid value=28 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 μm to 3.0 μm. Then, the result was cooled at room temperature, and exposed using a photomask with energy of 30 mJ/cm² to 100 mJ/cm² under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 μm to 3.0 μm was able to be secured at mask transmittance of 100%, and a favorable pattern having a film thickness of 1.0 μm to 2.5 μm was able to be secured at mask transmittance of 10% or less.

Example 3

Parts by weight of a carbon black dispersion (Tokushiki Co., Ltd. BK_5075 content 15%), 5 parts by weight of the binder resin synthesized in Synthesis Example 3 (Mw=2890 g/mol, acid value=44 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 μm to 3.0 μm. Then, the result was cooled at room temperature, and exposed using a photomask with energy of 30 mJ/cm$^2$ to 100 mJ/cm$^2$ under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 μm to 3.0 μm was able to be secured at mask transmittance of 100%, and a favorable pattern having a film thickness of 1.0 μm to 2.5 μm was able to be secured at mask transmittance of 10% or less.

Comparative Example 1

Parts by weight of a carbon black dispersion (Tokushiki Co., Ltd. BK_5075 content 15%), 5 parts by weight of the binder resin synthesized in Comparative Synthesis Example 1 (Mw=2700 g/mol, acid value=86 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 μm to 3.0 μm. Then, the result was cooled at room temperature, and exposed using a photomask with energy of 30 mJ/cm$^2$ to 100 mJ/cm$^2$ under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 μm to 3.0 μm was able to be secured at mask transmittance of 100%, and a favorable pattern having a film thickness of 1.0 μm to 2.5 μm was able to be secured at mask transmittance of 10% or less.

Comparative Example 2

Parts by weight of a carbon black dispersion (Tokushiki Co., Ltd. BK_5075 content 15%), 5 parts by weight of the binder resin synthesized in Comparative Synthesis Example 2 (Mw=2890 g/mol, acid value=69 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 μm to 3.0 μm. Then, the result was cooled at room temperature, and exposed using a photomask with energy of 30 mJ/cm$^2$ to 100 mJ/cm$^2$ under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 μm to 3.0 μm was able to be secured at mask transmittance of 100%, and a favorable pattern having a film thickness of 1.0 μm to 2.5 μm was able to be secured at mask transmittance of 10% or less.

Comparative Example 3

Parts by weight of a carbon black dispersion (Tokushiki Co., Ltd. BK_5075 content 15%), 5 parts by weight of the binder resin synthesized in Comparative Synthesis Example 3 (Mw=2810 g/mol, acid value=72 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 μm to 3.0 μm. Then, the result was cooled at room temperature, and exposed using a photomask with energy of 30 mJ/cm² to 100 mJ/cm² under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 µm to 3.0 µm was able to be secured at mask transmittance of 100%, and a favorable pattern having a film thickness of 1.0 µm to 2.5 µm was able to be secured at mask transmittance of 10% or less.

Comparative Example 4

35 Parts by weight of a carbon black dispersion (Tokushiki Co., Ltd. BK_5075 content 15%), 5 parts by weight of the binder resin synthesized in Comparative Synthesis Example 4 (Mw=2660 g/mol, acid value=0 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 µm to 3.0 µm. Then, the result was cooled at room temperature, and exposed using a photomask with energy of 30 mJ/cm² to 100 mJ/cm² under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 µm to 3.0 µm was able to be secured at mask transmittance of 100%, and a favorable pattern having a film thickness of 1.0 µm to 2.5 µm was able to be secured at mask transmittance of 10% or less.

Comparative Example 5

Parts by weight of a carbon black dispersion (Tokushiki Co., Ltd. BK_5075 content 15%), 5 parts by weight of the binder resin synthesized in Comparative Synthesis Example 5 (Mw=2920 g/mol, acid value=40 mgKOH/g), 5 parts by weight of a resin polymer including styrene/FA-513M and a reactive group as an acryl-based binder (Mw=8000 g/mol to 12000 g/mol, acid value=50 mgKOH/g to 100 mgKOH/g), 12 parts by weight of dipentaerythritol hexaacrylate as a multifunctional monomer, 1.0 parts by weight of Oxe 02 of BASF Corporation as a photoinitiator, 0.5 parts by weight of 3-methacryloxypropyltrimethoxysilane as an adhesion promoter, 0.5 parts by weight of F-475 (DIC Corporation) as a leveling agent, and 33 parts by weight of propylene glycol monomethyl ether acetate and 8 parts by weight of 3-methoxybutyl acetate as a solvent were mixed.

Then, the mixture was stirred for 5 hours to prepare a black photosensitive resin composition.

After spin coating the photosensitive resin composition prepared as above on a glass substrate, the result was preheat treated for 100 seconds at approximately 100° C. to form a film having a thickness of approximately 2.0 µm to 3.0 µm. Then, the result was cooled at room temperature, and exposed using a photomask with energy of 30 mJ/cm² to 100 mJ/cm² under a high-pressure mercury lamp. The exposed substrate was developed in a 0.04% aqueous potassium hydroxide (KOH) solution at a temperature of 25° C. using a spray method, then washed with pure water, dried, and post-baked for 20 minutes in a convection oven at 230° C.

The film obtained as above was obtained as a clean film having no surface defects caused from each process, a favorable pattern having a film thickness of 1.5 µm to 3.0 µm was able to be secured at mask transmittance of 100%, and a favorable pattern having a film thickness of 1.0 µm to 2.5 µm was able to be secured at mask transmittance of 10% or less.

Parts by weight of the compositions used in the examples and the comparative examples are summarized and described in the following Table 2.

TABLE 2

| | | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| Organic Black Dispersion (BK_5075) | | 35 | 35 | 35 | 35 | 35 | 35 | 35 | 35 |
| Binder Resin | Synthesis Example 1 | 5 | — | — | — | — | — | — | — |
| | Synthesis Example 2 | — | 5 | — | — | — | — | — | — |
| | Synthesis Example 3 | — | — | 5 | — | — | — | — | — |

TABLE 2-continued

|  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Comparative Synthesis Example 1 | — | — | — | 5 | — | — | — | — |
| Comparative Synthesis Example 2 | — | — | — | — | 5 | — | — | — |
| Comparative Synthesis Example 3 | — | — | — | — | — | 5 | — | — |
| Comparative Synthesis Example 4 | — | — | — | — | — | — | 5 | — |
| Comparative Synthesis Example 5 | — | — | — | — | — | — | — | 5 |
| Acryl-based Multifunctional Monomer (DPHA) | 5 | 5 | 5 | 5 | 5 | 5 | 5 | 5 |
|  | 12 | 12 | 12 | 12 | 12 | 12 | 12 | 12 |
| Photoinitiator (OXE-02) | 1 | 1 | 1 | 1 | 1 | 1 | 1 | 1 |
| KBM-503 | 0.5 | 0.5 | 0.5 | 0.5 | 0.5 | 0.5 | 0.5 | 0.5 |
| F475 | 0.5 | 0.5 | 0.5 | 0.5 | 0.5 | 0.5 | 0.5 | 0.5 |
| Solvent (PGMEA) | 33 | 33 | 33 | 33 | 33 | 33 | 33 | 33 |
| Solvent (3-MBA) | 8 | 8 | 8 | 8 | 8 | 8 | 8 | 8 |

In Table 2, DPHA, the multifunctional monomer, means dipentaerythritol hexaacrylate, and as the solvent, PGMEA means propylene glycol methyl ether acetate and 3-MBA means 3-methoxybutyl acetate. In order to evaluate developability and pattern adhesive strength of the films prepared in Examples 1 to 3 and Comparative Examples 1 to 5, a 5% transmittance smallest pattern (μm) and a level difference (A) were measured and described in the following Table 3. The 5% transmittance smallest pattern (μm) means a size of the smallest pattern attached on the substrate after development when performing exposure using a mask having transmittance of 5%. For example, when the exposure amount of the following Table 3 is 50 mJ/cm$^2$ and the mask transmittance is 5%, energy actually used in the exposure is 2.5 mJ/cm$^2$.

The level difference means a difference between the thickness of the pattern formed when the mask transmittance is 100% (A) and the thickness of the pattern formed when the mask transmittance is 5% (B), and is calculated by the value subtracting (B) from (A).

After calculating the thickness of the pattern formed when the mask transmittance was 100% (A) and the thickness of the pattern formed when the mask transmittance was 5% (B) in Examples 1 to 3 and Comparative Examples 1 to 5, the value subtracting (B) from (A) (level difference) was calculated and described in the following Table 3.

TABLE 3

|  | Exposure Amount (mJ/cm$^2$) | 5% Transmittance Smallest Pattern (μm) | | Level Difference (Å) |
|---|---|---|---|---|
|  |  | 0 Days | 3 Weeks |  |
| Example 1 | 45 | 14 | 14 | ⊙ |
|  | 50 | 12 | 12 | ⊙ |
|  | 55 | 12 | 12 | ⊙ |
| Example 2 | 45 | 17 | 17 | ⊙ |
|  | 50 | 15 | 16 | ⊙ |
|  | 55 | 14 | 16 | ⊙ |
| Example 3 | 45 | X | X | X |
|  | 50 | 17 | 19 | ⊙ |
|  | 55 | 16 | 17 | ⊙ |
| Comparative Example 1 | 45 | X | X | X |
|  | 55 | X | X | X |
| Comparative Example 2 | 45 | X | X | X |
|  | 50 | X | X | X |
|  | 55 | 19 | 25 | ○ |
| Comparative Example 3 | 45 | X | X | X |
|  | 50 | X | X | X |
|  | 55 | 17 | 24 | ∇ |
| Comparative Example 4 | 45 | X | X | X |
|  | 50 | 15 | 16 | Δ |
|  | 55 | 13 | 15 | Δ |

TABLE 3-continued

| | Exposure Amount (mJ/cm²) | 5% Transmittance Smallest Pattern (μm) | | Level Difference (Å) |
|---|---|---|---|---|
| | | 0 Days | 3 Weeks | |
| Comparative Example 5 | 45 | X | X | X |
| | 50 | 17 | 19 | Δ |
| | 55 | 16 | 18 | Δ |

⊙—8000 Å to 9500 Å
○—7000 Å to 8000 Å
Δ—6000 Å to 7000 Å
▽—6000 Å or less
X—Pattern fall out As shown in Table 3, it was seen that Examples 1 to 3 had either the same or a smaller 5% transmittance smallest pattern (μm) compared to Comparative Examples 1 to 5. In addition, it was seen that Examples 1 to 3 had a larger level difference compared to Comparative Examples 1 to 5.

When sensitivity is excellent, a size of a smallest pattern attached at 5% transmittance decreases due to increases in adhesive strength and developability resistance, however, a level difference tends to decrease due to sufficient curing even at a low exposure amount. Pattern adhesion and level difference are in a trade-off relationship, and when pattern adhesive strength increases, a level difference decreases, or when pattern adhesive strength decreases, a level difference increases.

However, by introducing a photocurable group, the cardo-based binder resin of the present disclosure has excellent sensitivity and increased developability resistance due to a decrease in the acid group, and, despite the decrease in the size of the 5% transmittance smallest pattern, a level difference increases by a small thickness of the 5% transmittance pattern (B). Accordingly, the present disclosure is capable of increasing both pattern adhesive strength and a level difference.

Hereinbefore, preferred embodiments of the present disclosure have been described, however, the present disclosure is not limited thereto, and various modifications may be made within the scope of the claims and the detailed descriptions of the disclosure, and these also fall within the category of the disclosure.

The invention claimed is:

1. A cardo-based binder resin represented by Chemical Formula 1:

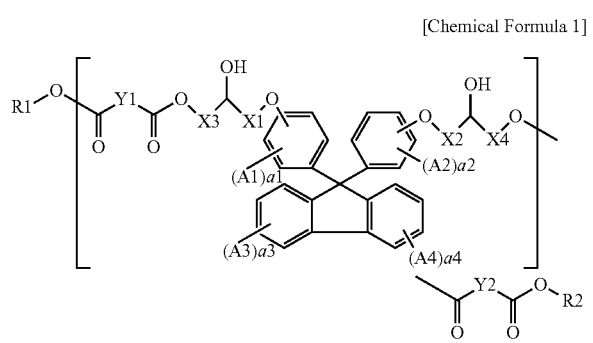

[Chemical Formula 1]

wherein, in the Chemical Formula 1,
R1 and R2 are hydrogen or represented by Chemical Formula 2;
at least one of R1 and R2 is represented by the Chemical Formula 2; and
n is an integer of 1 to 50,

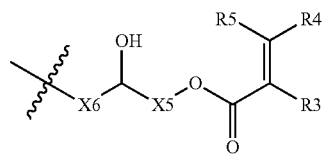

[Chemical Formula 2]

wherein, in Chemical Formula 2,

represents a site linked to Chemical Formula 1,
X1 to X6 are a substituted or unsubstituted alkylene group; or a substituted or unsubstituted alkylene oxide group;
Y1 and Y2 are selected from the group consisting of a substituted or unsubstituted alkylene group; a substituted or unsubstituted cycloalkylene group; a substituted or unsubstituted cycloalkenylene group; and a substituted or unsubstituted arylene group;
R3 to R5 are the same as or different from each other, and each independently hydrogen; or a substituted or unsubstituted alkyl group;
A1 to A4 are the same as or different from each other, and each independently selected from the group consisting of hydrogen; deuterium; a halogen group; a nitrile group; a nitro group; a hydroxyl group; an ester group; an imide group; an amide group; a substituted or unsubstituted alkoxy group; a substituted or unsubstituted alkyl group; a substituted or unsubstituted cycloalkyl group; a substituted or unsubstituted alkenyl group; a substituted or unsubstituted cycloalkenyl group; a substituted or unsubstituted silyl group; a substituted or unsubstituted boron group; a substituted or unsubstituted phosphine oxide group; a substituted or unsubstituted phosphine group; a substituted or unsubstituted sulfonyl group; a substituted or unsubstituted amine group; a substituted or unsubstituted aryl group; and a substituted or unsubstituted heteroaryl group; and
a1 to a4 are an integer of 0 to 4, and when a1 to a4 are 2 or greater, A1 to A4 are the same as or different from each other.

2. The cardo-based binder resin of claim 1, which has an acid value of 0 mg KOH/g to 50 mg KOH/g.

3. The cardo-based binder resin of claim 1, wherein X1 to X6 are a substituted or unsubstituted alkylene group having 1 to 3 carbon atoms; or a substituted or unsubstituted alkylene oxide group having 2 to 10 carbon atoms; and
Y1 and Y2 are selected from the group consisting of a substituted or unsubstituted alkylene group having 1 to 10 carbon atoms; a substituted or unsubstituted cycloalkylene group having 3 to 10 carbon atoms; a substituted or unsubstituted cycloalkenylene group having 3 to 10 carbon atoms; and a substituted or unsubstituted arylene group having 6 to 20 carbon atoms.

4. The cardo-based binder resin of claim 1, wherein R1 and R2 are represented by the Chemical Formula 2.

5. The cardo-based binder resin of claim 1, which has a weight average molecular weight of 1,000 g/mol to 10,000 g/mol.

6. A photosensitive resin composition comprising the cardo-based binder resin of claim 1.

7. The photosensitive resin composition of claim 6, further comprising:
a colorant;
a multifunctional monomer;
a photoinitiator; and
a solvent.

8. The photosensitive resin composition of claim 7, further comprising at least one selected from the group of an acryl-based binder resin; an adhesion promoter; and a leveling agent.

9. The photosensitive resin composition of claim 8, comprising
the cardo-based binder resin in 0.5 parts by weight to 10 parts by weight;
the colorant in 1 part by weight to 50 parts by weight;
the acryl-based binder resin in 0 part by weight to 10 parts by weight;
the multifunctional monomer in 1 part by weight to 20 parts by weight;
the photoinitiator in 0.1 parts by weight to 10 parts by weight;
the adhesion promoter in 0.01 parts by weight to 5 parts by weight;
the leveling agent in 0.01 parts by weight to 5 parts by weight; and
the solvent in 20 parts by weight to 95 parts by weight, based on 100 parts by weight of the photosensitive resin composition.

10. A black matrix formed using from the photosensitive resin composition of claim 6.

11. A color filter comprising the black matrix of claim 10.

12. A display apparatus comprising the black matrix of claim 10.

* * * * *